United States Patent [19]

Tan et al.

[11] Patent Number: 4,855,696
[45] Date of Patent: Aug. 8, 1989

[54] PULSE COMPRESSOR

[75] Inventors: Michael Tan, Mountain View; Chung-Yi Su, Milpitas; William J. Anklam, Santa Rosa, all of Calif.

[73] Assignee: Hewlett-Packard, Palo Alto, Calif.

[21] Appl. No.: 130,825

[22] Filed: Dec. 9, 1987

[51] Int. Cl.$^4$ .............................................. H01P 5/00
[52] U.S. Cl. ..................................... 333/20; 307/266; 307/320
[58] Field of Search .................. 333/20; 307/266, 320; 328/58, 65

[56] References Cited

U.S. PATENT DOCUMENTS

| | | | |
|---|---|---|---|
| 3,173,026 | 3/1965 | Nagumo | 333/20 X |
| 3,593,207 | 7/1971 | Woermbke et al. | 307/320 X |
| 3,882,431 | 5/1975 | Hopwood et al. | 307/320 X |
| 3,983,416 | 9/1976 | Cronson et al. | 333/20 X |
| 4,701,714 | 10/1987 | Agoston | 307/320 X |
| 4,719,429 | 1/1988 | Ikezi et al. | 333/20 X |

OTHER PUBLICATIONS

Watanabe et al, *Experiment on Soliton in Inhomogeneous Electric Circuit. II. Dissipation-Free Case*, Jonl. of the Physical Soc. of Japan, vol. 50, No. 9, 9/81; pp. 3166–3172.
"Pulse and Waveform Generation with Step Recovery Diodes", HP Application Note 918; pp. 1–22.
"The Monostable Tunnel Diode Trigger Circuit", pp. 936–946; vol. 54, No. 7; Jul. 1966.
"Generation of Subpicosecond Electrical Pulses on Coplanar Transmission Lines"; pp. 751–753; Applied Phys. Lett 48 (12), Mar. 24, 1986.
"Generation and Measurement of Ultrashort Current Pulses with Josephson Devices" by Sadeg M. Faris; Applied Phys. Lett 36 (12), Jun. 15, 1980; 1005–1007.
"Characteristics of Travelling Waves Along the Non--Linear Transmission Lines for Monolithic Integrated Circuits: A Review", Int. J. Electronics, 1985, vol. 58, No. 4, 649–669.
"K-dV Soliton in Inhomogeneous System"; Journal of the Physical Society of Japan; vol. 53, No. 10, Oct. 1984, pp. 3325–3334.
"Experiment on Soliton in Inhomogeneous Electric Circuit. I. Dissipative Case" by Muroya and Watanabe; Journal of the Physical Soc. of Japan, vol. 50, No. 9, 9/81; pp. 3159–3165.
"Theoretical and Experimental Studies of Lattice Solitons in Nonlinear Lumped Networks", by Hirota & Suzuki; Proceedings of the IEEE, vol. 61, No. 10, Oct. 73.

Primary Examiner—Paul Gensler
Attorney, Agent, or Firm—John A. Frazzini

[57] ABSTRACT

A pulse compressor consisting of a loaded transmission line having a pluraltiy of sections which have a ratio of dispersion to nonlinearity that decreases in the direction of pulse transmission.

14 Claims, 6 Drawing Sheets

INHOMOGENEOUS NONLINEAR TRANSMISSION LINE

EQUIVALENT LC NETWORK

INHOMOGENEOUS NONLINEAR TRANSMISSION LINE

EQUIVALENT LC NETWORK

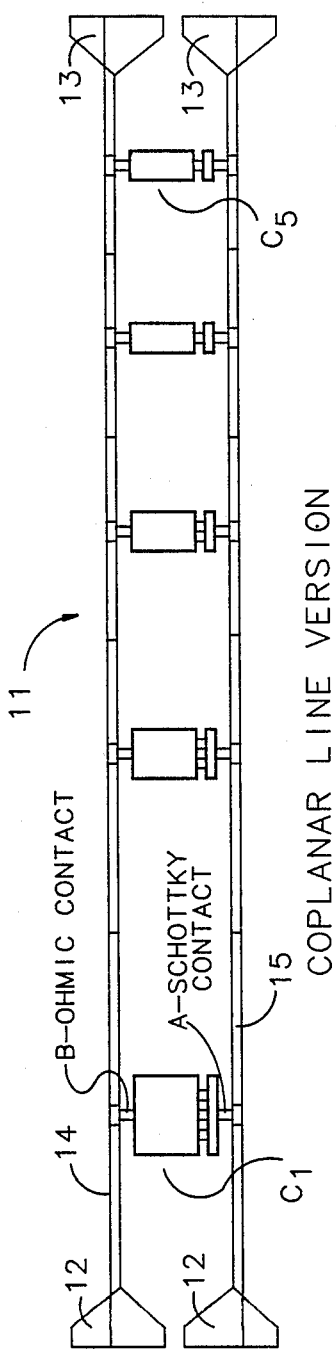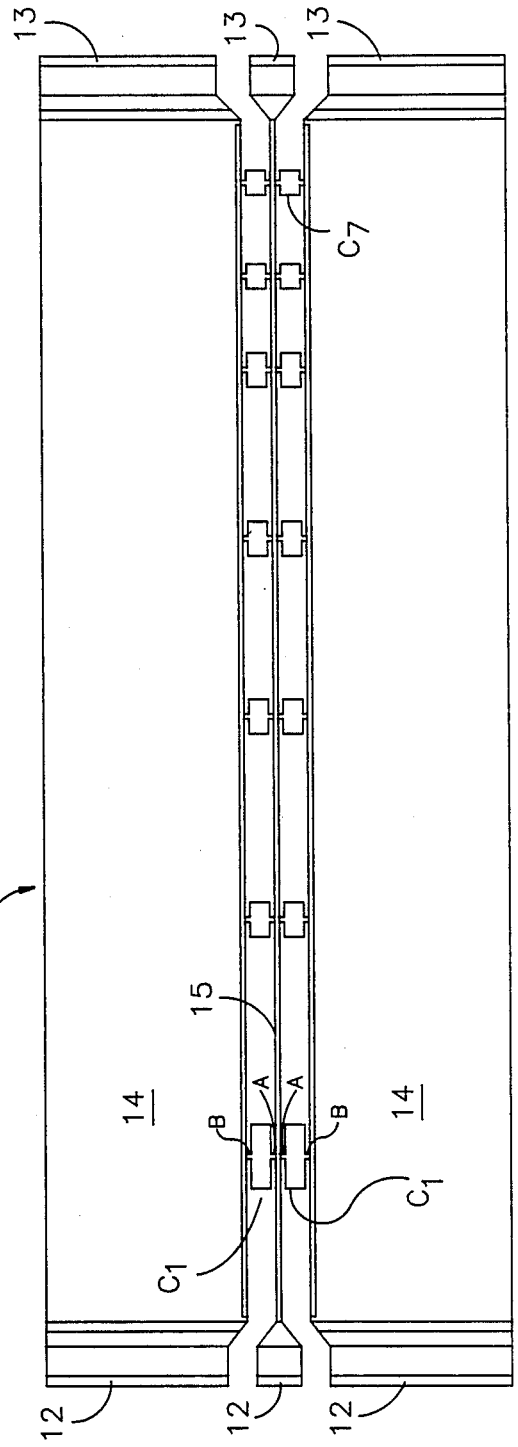

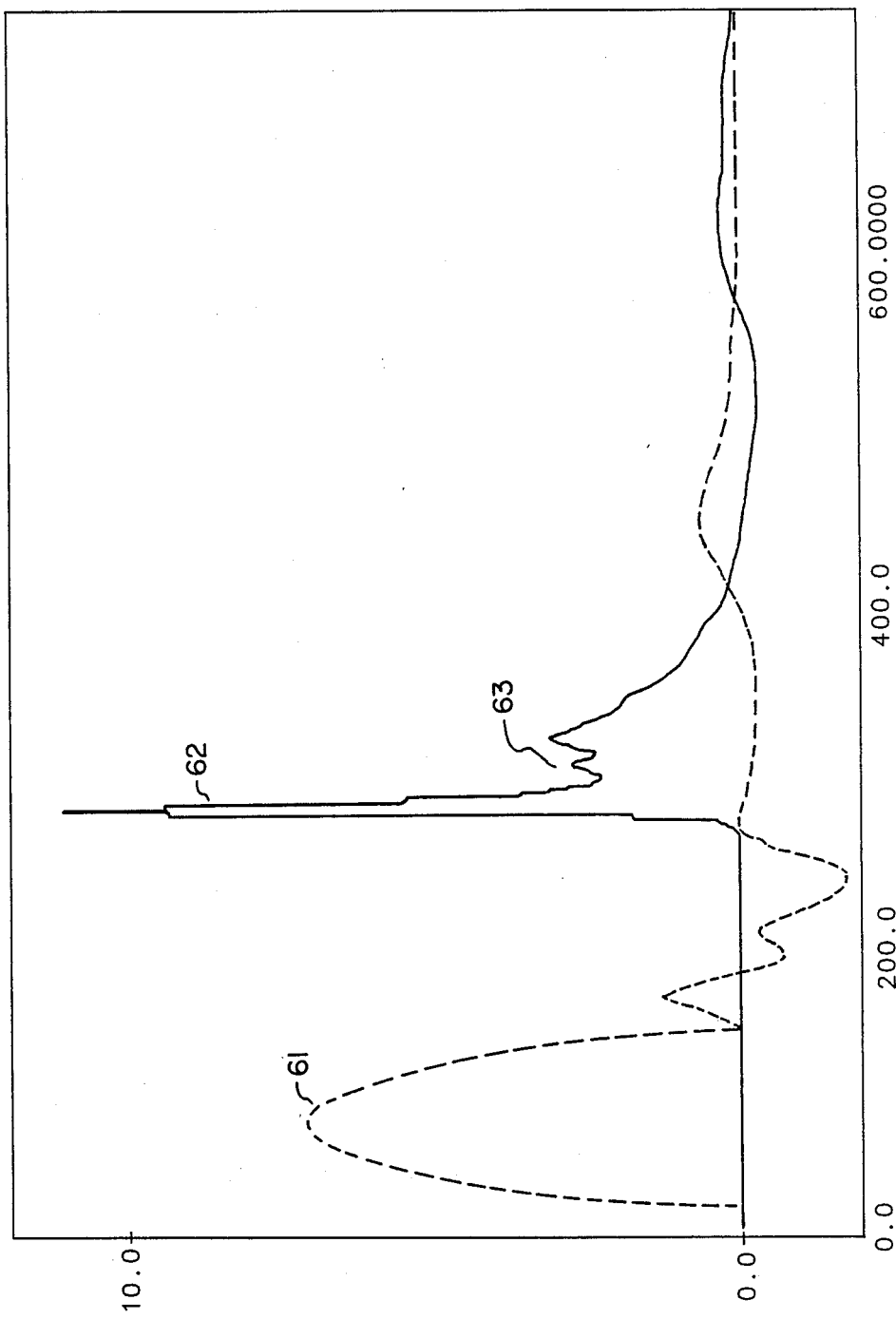

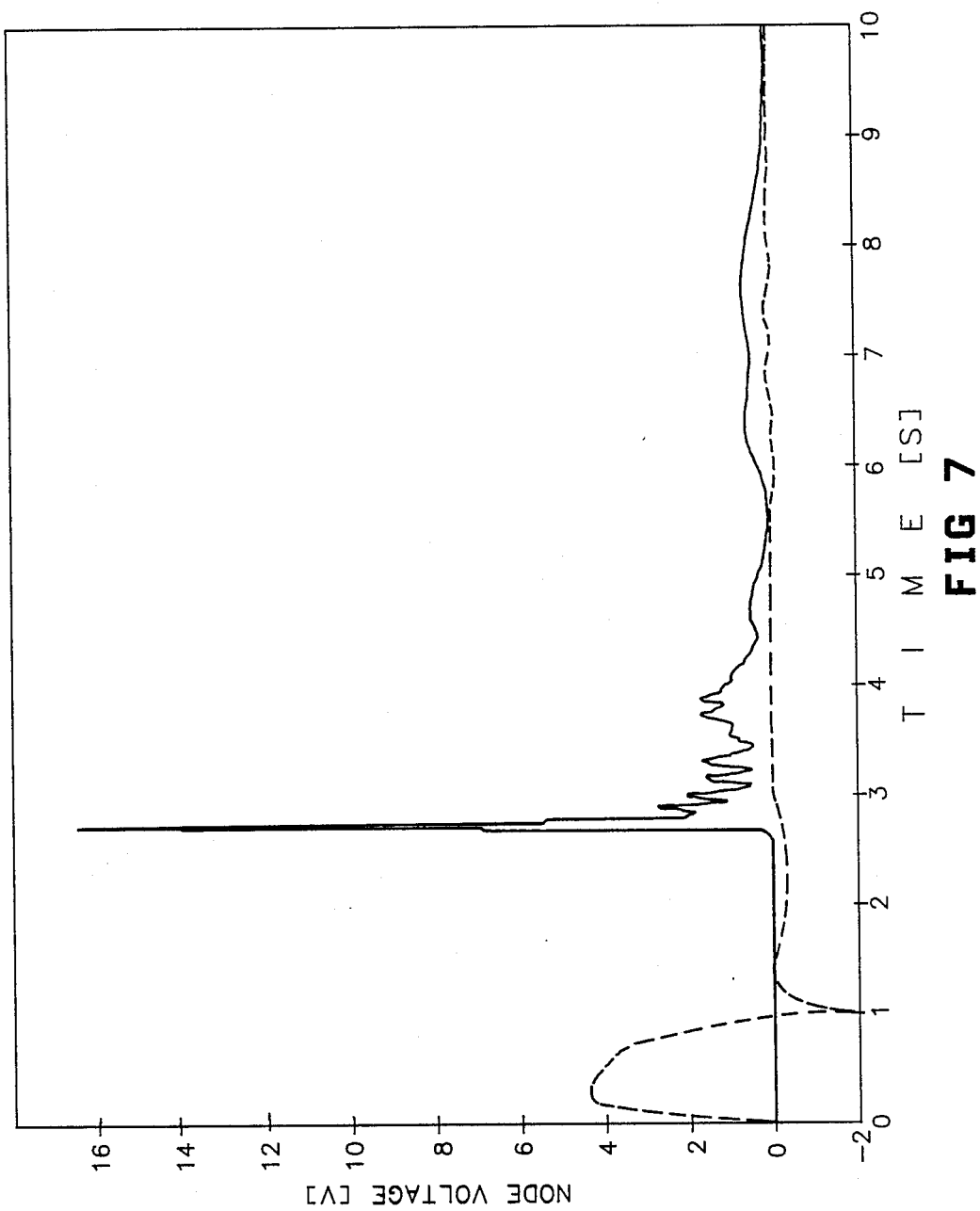

PULSE COMPRESSOR

BACKGROUND AND SUMMARY OF THE INVENTION

This invention relates in general to pulse generators and relates more particularly to a pulse compressor that is capable of generating large amplitude, small width pulses. Generation of picosecond pulses is necessary for many applications including applications involving characterization of very high speed transient phenomena or very high bandwidth sampling, mixing, or speed/delay-time testing. In these applications, the pulses can be used as a trigger, an excitation signal or a time base reference.

Picosecond pulses are presently generated by several different techniques. In Hewlett-Packard Application Note 918 entitled PULSE AND WAVEFORM GENERATION WITH STEP RECOVERY DIODES, a step recovery diode is used to produce a travelling wave pulse having a very steep leading edge. This pulse travels along a transmission line past a point at which an output signal is tapped from the transmission line. This wave is then reflected back with opposite polarity past the output tap so that the resulting output signal is a pulse of width equal to the rise time of the leading edge of the travelling wave pulse plus the round trip time for the pulse to travel from the output tap to the reflection point and back to the output tap. As a result of this, these pulses in general have a Full Width at Half Maximum (FWHM) greater than 35 picoseconds. These pulses are inherently limited by the minority carrier lifetime of the step recovery diode.

In W. C. G. Ortel, THE MONOSTABLE TUNNEL DIODE TRIGGER CIRCUIT, Proc. IEEE, vol. 54, pp. 936–946, July 1966, is presented a pulse generator that utilizes tunnel diodes in place of the step recovery diodes. Unfortunately, although narrower pulses can be achieved than with step recovery diodes, the output voltage is at most a few hundred millivolts.

In M. B. Ketchen, et. al., GENERATION OF SUBPICOSECOND ELECTRICAL PULSES ON COPLANAR TRANSMISSION LINES, Appl. Phys. Lett., vol. 48, pp. 751–753, Mar. 24, 1986, picosecond and subpicosecond pulses are generated by photogeneration of carriers. Unfortunately, this technique requires expensive, sophisticated and bulky lasers to generate picosecond or subpicosecond optical excitation pulses. In addition, bulk optics is needed to focus the laser beam onto the circuits.

In S. M. Faris, GENERATION AND MEASUREMENT OF ULTRASHORT CURRENT PULSES WITH JOSEPHSON DEVICES, Appl. Phys. Lett., vol. 36, pp. 1005–1007, June 15, 1980, picosecond pulses are generated using superconducting Josephson junction technology. Historically, this has required expensive apparatus to maintain the temperatures required for superconductivity. Although it appears that room temperature superconductivity may be possible, at present it is still only a hope for the future.

The Colby Instruments, Inc. model PG 5000A pulse generator is an example of a conventional commercially available pulse generator. This technique uses an active device, such as an FET, to amplify and clip an input signal leaving only the high slew rate portion of the resulting waveform. These pulse generators are expensive and are limited to rise/fall times greater than 35 picoseconds and pulsewidths greater than 100 picoseconds.

In D. Jager, CHARACTERISTICS OF TRAVELLING WAVES ALONG THE NON-LINEAR TRANSMISSION LINES FOR MONOLITHIC INTEGRATED CIRCUITS: A REVIEW, Int. J. Electronics, vol. 58, pp. 649–669, 1985, a distributed pulse compression technique has been proposed, but has not been reduced to practice. In direct analogy to compression of optical pulses, this method utilizes dispersion and nonlinearity in the compressing medium in which the pulse envelope is slowly varying compared to the carrier frequency. This technique is not applicable for direct electrical compression of pulses in which no carrier signal is involved. This technique utilizes a wide band of frequencies in excess of 200 GigaHertz and solution of the associated soliton problem involves the nonlinear Schroedinger equation. In contrast to this, the direct pulse compression technique presented herein involves the band of frequencies from dc to about 100 GigaHertz and the associated soliton problem involves the Kortweg-deVries equation.

In D. H. Auston, M. C. Juss and P. R. Smith, ELECTRICAL PULSE COMPRESSION BY TRAVELLING-WAVE PHOTOCONDUCTIVITY, Picosecond Electronics and Optoelectronics Conference Technical Digest, pp. 188–190, January 1987, a laser pulse produces a local high conductance spot in a transmission line that produces a travelling-wave pulse that acts effectively as a moving short. In theory, the relativistic Doppler effect will compress an incident electrical pulse in the transmission line, but this device has also not been reduced to practice. Also, this technique requires an external laser source, bulk optics and diffraction gratings, thereby increasing cost and complexity and preventing the pulse compressor from being manufactured as a monolithic structure.

It would be advantageous to have a design that enables production as a monolithic structure in order to reduce size, reduce manufacturing costs, reduce the effects of parasitic circuit elements as compared to lumped or hybrid configurations, and improve reliability. Most importantly, a monolithic structure enables the generation of electrical pulses with widths as small as several picoseconds. It would also be advantageous to avoid the expense of external lasers, external optics, and/or cryogenic cooling as are needed in the optical and Josephson junction devices discussed above.

In accordance with the present invention, a monolithic design is presented in which electrical pulses are directly compressed by use of a transmission line having both nonlinearity and dispersion. Fourier analysis of waveforms shows that pulses having a steep leading edge must have Fourier components of period comparable to the pulse rise time. Thus, in order to compress a pulse, an increased amount of high frequency components must be generated by the compressor. This generation is provided by the nonlinearity of this pulse compressor.

Wave propagation on a dispersive, nonlinear transmission, line is in general characterized by an initial steepening of the input rising edge (i.e., shock wave formation) followed by a breakup into stable solitary waves, called solitons. The nonlinearity causes the formation of a shock front corresponding to the generation of higher frequency harmonics. Because of dispersion, these harmonics propagate at different velocities which in turn oppose the formation of the shock wave (i.e., broaden the fast rising edge). The dynamic interaction between the nonlinearity and the dispersion proceeds until a balance is achieved whereby the amplitudes of the harmonics stay fixed and their phase velocities are equal, resulting in a wave of permanent profile called a soliton.

In such a transmission line, an electrical pulse injected into an input end of the transmission line, will in general break up into a set of solitons which then travel independently at different velocities along the transmission line. The velocity of each soliton depends on the amplitude of that soliton so that, not only are multiple pulses produced instead of a single pulse, it becomes difficult to predict the temporal interval between the times at which these pulses reach the output of the pulse generator. Such a situation is not well suited for a pulse generator.

In accordance with the illustrated preferred embodiment, a loaded transmission line is presented that has nonlinearity and dispersion selected to compress a pulse without producing a significant amount of unwanted secondary pulses. Loading the transmission line at varying intervals with varactors introduces both nonlinearity and dispersion. The unloaded transmission line should have a low enough amount of dispersion that the dispersion of the loaded transmission line is determined by the locations and parameters of the varactors used to load the transmission line. The pulse that is injected into the input end of the transmission line is selected to have a profile that approximately matches the profile of a stable soliton. As a result of this match, any breakup of this input pulse results in a large primary soliton and a low level oscillatory tail which correspond to energy that is not coupled into the primary soliton. The degree of match is chosen so that the secondary solitons contribute only a negligible amount of signal to the ripple in the output signal of the pulse generator.

The most important property of solitons for the present compressor is that the pulsewidth of a stable soliton decreases with increasing amplitude, lower dispersion and higher nonlinearity. Therefore, the transmission line is selected to have a ratio of dispersion to nonlinearity that decreases in the direction of propagation. This can be achieved by decreasing the dispersion and/or increasing the nonlinearity along the direction of propagation.

The pulse compressor consists of a loaded transmission line having successive sections in each of which this ratio is substantially constant. The sections are designed so that this ratio decreases from section to section along the direction of pulse transmission. The limiting case of a single varactor per section has the advantage of reduced length for a given total change in the ratio of dispersion to nonlinearity. The values of inductance per section and capacitance per section are each varied in a manner that, for a fixed amount of compression and number of compressor sections, minimizes the fraction of input energy that is not coupled into the primary soliton.

This design is advantageous in that the operation of many types of devices, such as samplers, triggers and pulse generator/driver circuits can be easily enhanced by the monolithic integration of such a pulse compressor with such circuits. For example, extremely narrow laser pulses can be generated by triggering the laser with pulses generated by a pulse generator that incorporates this pulse compressor.

DESCRIPTION OF THE FIGURES

FIG. 2 shows an embodiment of the pulse compressor of FIG. 1 utilizing a coplanar strip transmission line.

FIG. 3 shows an embodiment of the pulse compressor of FIG. 1 utilizing a coplanar waveguide.

FIG. 6 is a numerical simulation of a compressor having 10 sections.

FIG. 7 is a numerical simulation of a compressor having 20 sections.

DESCRIPTION OF THE PREFERRED EMBODIMENT

Figure 1A:
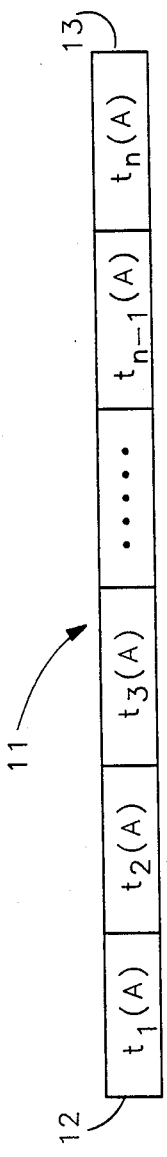
FIG. 1A is a block diagram of the pulse compressor circuit utilizing discrete sections in each of which the ratio of dispersion to nonlinearity is constant within that section.

A block diagram of the pulse compressor is presented in FIG. 1A. This pulse compressor consists of a loaded, nonlinear transmission line 11 having an input port 12 and an output port 13. This compressor contains n sections, the kth of which supports a soliton with a Full Width at Half Maximum (FWHM) of $t_k(A)$, where A is the amplitude of a signal travelling down the transmission line and $t_{k+1}(A) < t_k(A)$. Each section is loaded with one or more varactors. The inductance of the kth section is equal to the inductance per unit length of the unloaded transmission line times the length $l_k$ of the kth section. The capacitance per section provided by the varactors in a section is chosen to be much larger than the capacitance of that section introduced by the unloaded transmission line so that nonlinear capacitance of these varactors will introduce a significant nonlinearity in the capacitance per section.

Figure 1B:
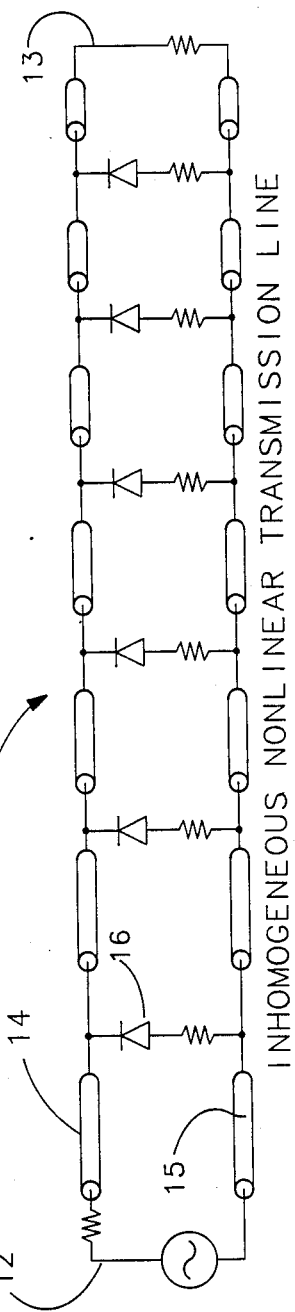
FIG. 1B is a schematic diagram of the pulse compressor of FIG. 1A in which there is a single varactor per section, thereby distributing throughout the compressor the variation of the ratio of dispersion to nonlinearity. Reverse biased Schottky diodes are used as varactors.
Figure 1C:
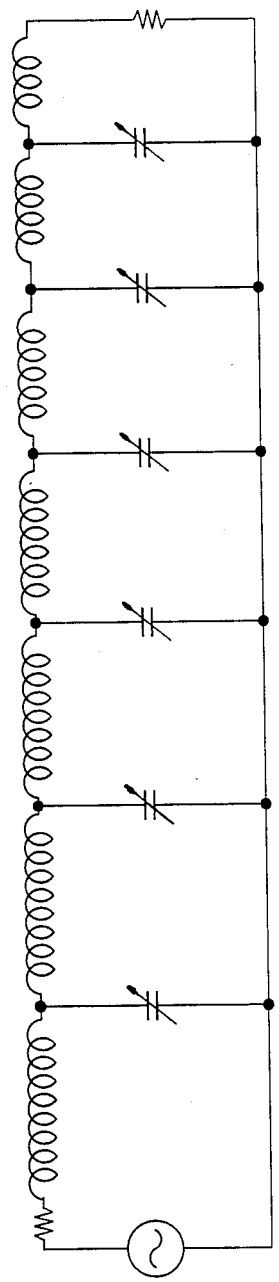
FIG. 1C is an equivalent circuit to the schematic diagram of FIG. 1B

In FIG. 1B is shown an embodiment in which the transmission line is loaded with a single varactor (reverse biased Schottky diode) per section. In FIG. 1C is an equivalent circuit to the schematic diagram of FIG. 1B. The loaded transmission line consists of an unloaded transmission line (consisting of a first conductor 14 and a second conductor 15) and a set of parallel connected reverse biased diodes 16. These reverse biased diodes provide, in each section of the transmission line, an amplitude dependent capacitance that dominates the capacitance for that section. An input pulse which varies with time as p(t) is applied at input port 12 and produces a signal that travels to the right along the transmission line.

The kth varactor is centered within a section of length $l_k$ so that the capacitance per unit length of the kth section is $C_o + C_k/l_k$, where $C_o$ is the intrinsic capacitance per unit length of the transmission line when it is not loaded with discrete varactors and where $C_k$ is the capacitance of the discrete varactor in the kth section. $C_o$ and the inductance per unit length of the transmission line are each determined by the distance $d_k$ between the two conductive lines, the width of the lines and the substrate dielectric constant within the kth section. Thus, the inductance per section of the kth section can be varied by varying $d_k$ and $l_k$. The capacitance per section of the kth section can be varied by varying $d_k$, $C_k$ and $l_k$.

In integrated circuits, transmission lines can be easily produced by forming a ground plane on one side of a substrate and forming a microstrip conductor on the other side of the substrate. In order to load such a transmission line, the discrete capacitors need to make electrical contact with both the strip line and the ground plane. This can be accomplished by forming capacitors in the substrate and then forming contact vias that extend through the substrate to both the ground plane and the strip line. This necessarily requires very thin substrates. However, such a process is not particularly well suited for device fabrication. Imageline could also be used, but such an embodiment does not propagate signals down to dc and is not compatible with fabrication steps of most circuits. Therefore, it is preferred to use either coplanar waveguide, coplanar line or slot line embodiments. These are easily implemented because they require only single-sided metalization and are easy to integrate with active devices.

Figure 4:
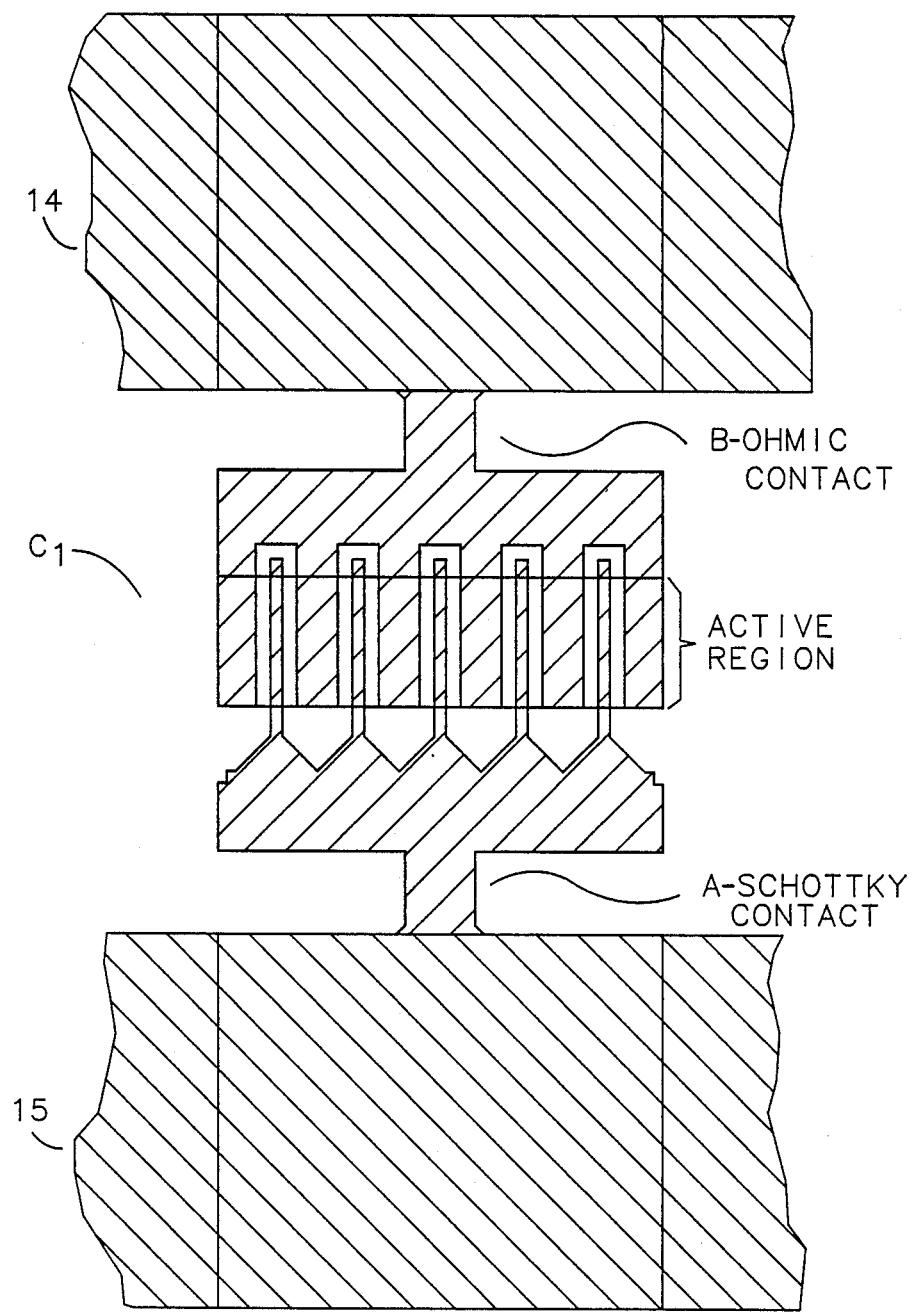
FIG. 4 is an expanded view of section 1 of the embodiment of FIG. 3.

FIG. 2 presents a coplanar line version having five sections and FIG. 3 presents a coplanar waveguide version having 7 sections. Each section in FIGS. 2 and 3 contains a single diode. FIG. 4 shows in greater detail the structure of section 5 of the transmission line of FIG. 2. The manufacture of the compressor utilizing planar technology is illustrated in FIGS. 5A-5D.

Figure 5A:
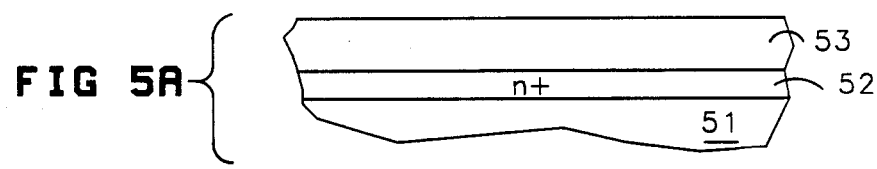
FIGS. 5A–5D illustrate process steps for producing a section of the compressor.

In FIG. 5A, epitaxial layers of doped GaAs are grown (for example, by Molecular Beam Epitaxy (MBE)) on a semi-insulating (undoped) GaAs substrate 51. The epitaxial layer consists of a thin, highly doped n+layer 52 of GaAs on which is grown a second layer 53 where the doping concentration increases with distance from the top of layer 52. The variation in doping concentration determines the nonlinear capacitance variation with reverse bias voltage of the diodes.

The active regions on the doped substrate where the discrete diodes will be formed are isolated from one another by proton isolation. Proton isolation makes the doped region semi-insulating by damaging the crystal structure of the doped layer.

Figure 5B:
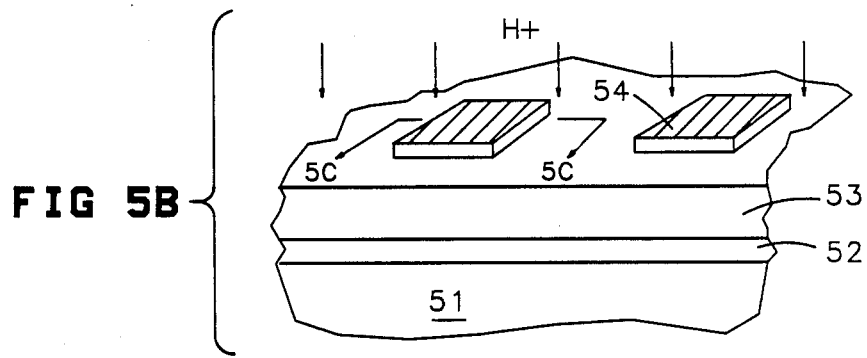
Figure 5C:
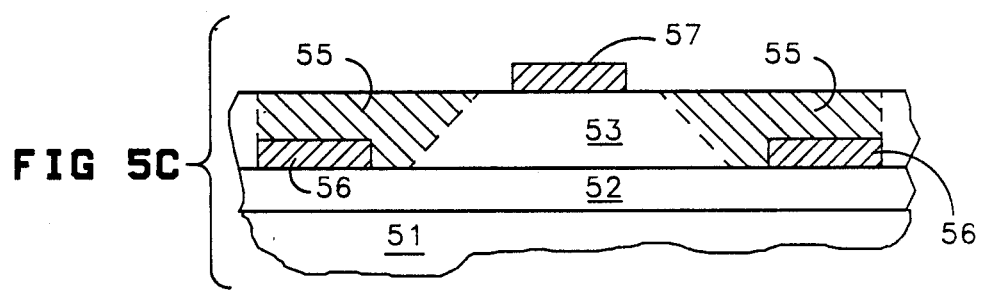
Figure 5D:
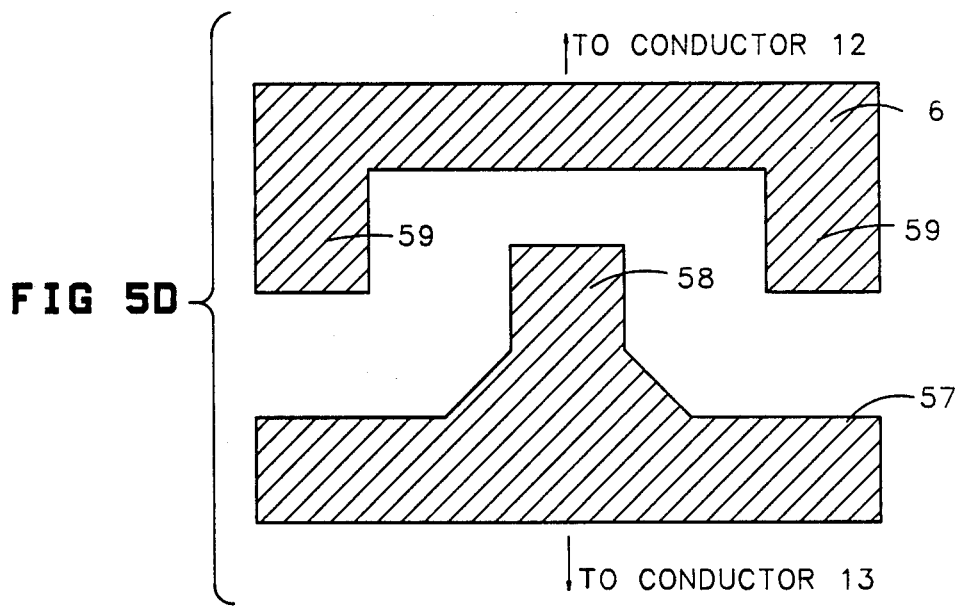

This proton isolation step is illustrated in FIG. 5B. A metal layer is deposited o top of layer 53 and is patterned to form a mask 54. The surface of layer 53 is bombarded by a beam of protons (H+) which produces a high resistivity region except where layer 53 is protected from this beam by mask 54. This serves to produce isolated regions (i.e., the regions protected by the mask) in which the separate diodes can be formed. One of these regions is illustrated in FIGS. 5C and 5D.

Mask 54 is removed and contact openings 55 are formed through layer 53 to layer 52. In these contact openings are formed metal regions 56 which form the ohmic contact of the diode. On top of layer 53 is formed a metal contact 57 that forms a Schottky contact with layer 53. Metal 56 is connected to conductor 14 and metal 57 is connected to conductor 15 to couple this diode into the transmission line. The diodes in FIG. 2 have a plurality of fingers 58 and more than two fingers 59, thereby forming a varactor that is just several diodes like that in FIG. 5A-5D connected in parallel. In all of the above steps, photolithographic techniques are used to define the active regions, ohmic regions, Schottky regions and connect metal (transmission line) regions.

In FIG. 3, the transmission line contains 7 sections, each having a single diode contained in a "diode cell" centered on that diode. In one particular embodiment, the transmission line contains 10 diode cells with a total length of 3.2 mm. The unloaded transmission line has a characteristic impedance $Z_o$=150 ohms with relative phase velocity equal to 0.39 times the speed of light in vacuum. The delay time indicated below is the transmission delay time through a diode cell without the diode present. The diodes are hyper-abrupt junction diodes (i.e., having nonuniform doping) and the parameter $C_k(0)$ of the kth cell is the zero bias junction capacitance of the Schottky diodes. The capacitance variation with voltage V is $C_k(V)=C_k(0)/(1+V/V_0)^a$ for some constant a. The doping profile of the diodes has the form $N_d(x)=N_0*(x_0/x)m$ where $N_0$ is a constant equal to the doping concentration at a distance $x_0$ from the top surface of the GaAs epitaxial layer. The constant a is related to the constant m by the relation $a=1/(2-m)$.

In one particular embodiment, the following parameter values were utilized: a=1.25 (i.e., m=1.2), compressor length=3.21 mm, characteristic impedance of unloaded transmission line=150 Ohms, the zero bias capacitances of the Schottky diodes and delay times per section are:

| k | $C_k$ (pF) | delay time (ps) |
|---|---|---|
| 1 | 2.00 | 6.67 |
| 2 | 1.81 | 4.85 |
| 3 | 1.62 | 3.82 |
| 4 | 1.43 | 3.07 |
| 5 | 1.24 | 2.49 |
| 6 | 1.06 | 2.00 |
| 7 | 0.87 | 1.61 |
| 8 | 0.68 | 1.25 |
| 9 | 0.49 | 0.94 |
| 10 | 0.30 | 0.67 |

The inductance $L_k$ of the kth section is given by the product of the delay time and the unloaded impedance.

FIG. 6 shows a numerical (SPICE) simulation of the transient response of the above pulse compressor subject to a half-sine wave input pulse 61 with a full width at half maximum (FWHM) equal to 70 ps and an amplitude of 5 volts. This choice of input waveform excites a single soliton which is larger in amplitude and narrower in width than the input waveshape. The resulting output pulse 62 has a FWHM equal to 7 ps so that there is a 10-fold compression. Also present at the output is a shelf 63 of uncompressed energy which can be minimized by using more diode sections distributed over a longer length of transmission line.

FIG. 7 is a numerical simulation of a compressor having 20 diode sections. This embodiment has m=1.1 and the zero bias capacitances of the Schottky diodes and delay times per section are:

| k | $C_k$ (pF) | delay time (ps) |
|---|---|---|
| 1 | 2.00 | 6.67 |
| 2 | 1.91 | 5.28 |
| 3 | 1.82 | 4.47 |
| 4 | 1.73 | 3.89 |
| 5 | 1.64 | 3.45 |
| 6 | 1.55 | 3.08 |
| 7 | 1.46 | 2.77 |
| 8 | 1.37 | 2.50 |
| 9 | 1.28 | 2.27 |
| 10 | 1.19 | 2.06 |
| 11 | 1.11 | 1.87 |

-continued

| k | $C_k$ (pF) | delay time (ps) |
|---|---|---|
| 12 | 1.02 | 1.69 |
| 13 | 0.93 | 1.53 |
| 14 | 0.84 | 1.38 |
| 15 | 0.75 | 1.24 |
| 16 | 0.66 | 1.11 |
| 17 | 0.57 | 0.99 |
| 18 | 0.48 | 0.88 |
| 19 | 0.39 | 0.77 |
| 20 | 0.30 | 0.67 |

It can be seen that the amount of uncompressed energy is significantly reduced in this embodiment compared to the embodiment for which the simulation is presented in FIG. 6.

The overall length of the compressor can be reduced by utilizing hyperabrupt diodes with higher values of a. In addition, choosing the unloaded transmission line characteristic impedance to be as large as possible permits larger capacitive loading by the varactors yielding even greater compression within shorter device length.

Every section in the transmission line need not contain just a single diode. In a section having multiple diodes, each diode is contained in a "diode cell" centered on that diode. In one particular embodiment, the transmission line contains 90 diode cells distributed in six sections. The unloaded transmission line has a characteristic impedance $Z_o = 90$ ohms with relative phase velocity equal to 0.39 times the speed of light in a vacuum. The delay time indicated below is the transmission delay time through a diode cell. The diodes are abrupt junction diodes (i.e., have uniform doping so that $a = 0.5$) and the parameter $C_k(0)$ of the kth cell is the zero bias junction capacitance of the capacitor. The parameters for these diode cells were selected to be:

| k | # Cells | $C_k$ (fF) | delay time (ps) |
|---|---|---|---|
| 1 | 20 | 150 | 3.5886 |
| 2 | 10 | 130 | 3.1020 |
| 3 | 10 | 110 | 2.6316 |
| 4 | 10 | 90 | 2.1552 |
| 5 | 20 | 70 | 1.6747 |
| 6 | 20 | 50 | 1.1962 |

The input pulse is triangular With a full Width at half maximum (FWHM) equal to 18 ps and amplitude of 5 Volts. This choice matches reasonably well the pulse width/amplitude profile of solitons transmitted by the first section. The resulting output pulse has a FWHM equal to 6 ps so that there is a 3-fold compression. The overall length of the compressor can be reduced by utilizing hyperabrupt diodes (i.e., diodes in which the doping profile has the form $N_d(x) = N_0^*(x_0/x)^m$) and exhibit a capacitance $C(V) = C(0)/(1+V/V_o)^a$ for some constant a. Such diodes exhibit an increased nonlinearity compared to graded junction diodes and abrupt diodes. In addition, choosing the unloaded transmission line characteristic impedance to be as large as possible, permits larger capacitive loading by the varactors yielding even greater compression within shorter device length.

These numerical simulations illustrate that this design is capable of producing compressed output pulses having a peak amplitude $A_c$ much larger than the peak amplitude $A_u$ of the uncompressed energy in the output signal. In particular, $A_u$ is less than 30% of $A_c$. In addition, $A_c$ is over 6 volts larger than $A_u$. This is advantageous because this amplitude difference makes these output pulses usable for driving a sampling bridge.

We claim:

1. A pulse compressor comprising:
    an unloaded transmission line of length $L_t$ having an input and an output; and
    means for injecting at the compressor input a pulse having a profile tht sufficiently matches the profile of a stable soliton at the input end of the compressor that only a single soliton is generated by the input pulse;
    a plurality of varactors that load the transmission line at a plurality of points along the transmission line, thereby defining a plurality of varactor cells, each of which is centered on a varactor and is contiguous with the adjacent cells;
    each varactor cell has a nonlinear capacitance [C]C(V) per cell and an inductance L per cell in which V is the voltage drop across that varactor and in which the [(LC)½]time constant $(LC(0))^{\frac{1}{2}}$ decreases from a first cell at the transmission line input to a last cell at the transmission line output where the change from cell to cell of the [(LC)½]*time constant* $(LC(0))^{\frac{1}{2}}$ is chosen to compress said soliton and to substantially minimize, at the output, the peak amplitude of uncompressed energy, which includes secondary solitons, whereby the formation of secondary solitons is suppressed.

2. A compressor as in claim 1 wherein the unloaded transmission line has a dispersion much less than the dispersion introduced by the loading varactors, whereby the amount of dispersion is controlled by the selection of the locations and parameters of the loading varactors.

3. A compressor as in claim 1 wherein the vacators are reverse biased diodes.

4. A compressor as in claim 3 wherein the diodes are hyperabrupt diodes.

5. A compressor as in claim 4 wherein the hyperabrupt diodes have a capacitance $$C(V) = C(0)/(1+V/V_o)^a$$

for some constants a, C(0) and $V_o$.

6. A compressor as in claim 5 wherein a is greater than 0.5.

7. A compressor as in claim 1 wherein L decreases monotonically from cell to cell, beginning with the first cell.

8. A compressor as in claim 1 wherein each varactor in a cell has a series resistance R such that the RC(O) time constant of a cell is much less than the $(LC(O))^{\frac{1}{2}}$ time constant of that cell so that a signal propagating along the compressor does not have its rise time limited by the RC time constant of any cell.

9. A compressor as in claim 1 wherein the transmission line is a coplanar stripline type of transmission line.

10. A compressor as in claim 1 wherein the transmission line is a coplanar waveguide type of transmission line.

11. A compressor as in claim 1 in which C(0) decreases monotonically from the first cell to the last cell.

12. A compressor as in claim 1 wherein, at the transmission line output, an output signal is produced having a compressed pulse of peak amplitude $A_c$ and an uncompressed energy signal having a peak amplitude $A_u$ with $A_c > A_u + 6$ volts.

13. A compressor as in claim 1 wherein, at the transmission line output, an output signal is produced having a compressed pulse of peak amplitude $A_c$ and an uncompressed energy signal having a peak amplitude $A_u$ with $A_u/A_c < 30\%$.

14. A compressor as in claim 1 wherein no two of said cells have equal values of LC(0).

* * * * *

UNITED STATES PATENT AND TRADEMARK OFFICE
CERTIFICATE OF CORRECTION

PATENT NO. : 4,855,696

DATED : August 8, 1989

INVENTOR(S) : Michael Tan; Chung-Yi Su; William J. Anklam

It is certified that error appears in the above-identified patent and that said Letters Patent is hereby corrected as shown below:

Column 2, line 61, "mission, ,line" should be --mission line--;
Column 8, line 14,"[C]C(V) per" should be --C(V) per--;
Column 8, line 16, "the [(LC) 1/2] time" should be --the time--;
Column 8, line 20, "the [(LC) 1/2] time" should be --the time--.

Signed and Sealed this

Twelfth Day of June, 1990

Attest:

HARRY F. MANBECK, JR.

*Attesting Officer*      *Commissioner of Patents and Trademarks*